United States Patent
Lin et al.

(10) Patent No.: US 6,245,608 B1
(45) Date of Patent: Jun. 12, 2001

(54) ION IMPLANTATION PROCESS FOR FORMING CONTACT REGIONS IN SEMICONDUCTOR MATERIALS

(75) Inventors: Tsai-Sen Lin, Taichung; Chon-Shin Jou, Hsinchu; Der-Tsyr Fan, Taipei, all of (TW)

(73) Assignee: Mosel Vitelic Inc., Hsinchu (TW)

(*) Notice: Subject to any disclaimer, the term of this patent is extended or adjusted under 35 U.S.C. 154(b) by 0 days.

(21) Appl. No.: 09/332,125

(22) Filed: Jun. 14, 1999

(51) Int. Cl.[7] ............................. H01L 21/8238
(52) U.S. Cl. .................. 438/233; 438/529; 438/546; 438/919
(58) Field of Search .......................... 438/228, 229, 438/232, 233, 306, 307, 527, 529, 546, 551, 552, 919

(56) References Cited

U.S. PATENT DOCUMENTS

| | | | |
|---|---|---|---|
| 4,406,710 | * 9/1983 | Davies et al. | 438/232 |
| 4,420,344 | * 12/1983 | Davies et al. | 438/232 |
| 4,553,315 | * 11/1985 | McCarty | 438/233 |
| 4,956,311 | * 9/1990 | Liou et al. | 438/233 |
| 5,908,309 | * 6/1999 | Andoh | 438/919 |

* cited by examiner

Primary Examiner—Chandra Chaudhari
(74) Attorney, Agent, or Firm—Nath & Associates PLLC; Harold L. Novick

(57) ABSTRACT

A method of contact ion implantation is disclosed. Only one mask and a dosage-enhanced implantation is utilized to form different types of doped contact regions. A blanket ion implantation is first carried out, and all the contact regions of first and second type are formed with the first conductive type impurities. Then a mask is defined to cover the first type contact regions and expose the second type regions. A second ion implantation is now carried out to implant impurity ions of second conductive type into the second type contact regions. The dosage of these second conductive type ions is determined so that, the second type contact regions are convert from the first conductive type into section conductive type.

19 Claims, 5 Drawing Sheets

ION IMPLANTATION PROCESS FOR FORMING CONTACT REGIONS IN SEMICONDUCTOR MATERIALS

FIELD OF THE INVENTION

The present invention relates to a semiconductor process, and more especially, to a method of an ion implantation for forming the contact areas in the semiconductor materials.

BACKGROUND OF THE INVENTION

In semiconductor industry, the conductive areas in a semiconductor material are generally formed of impurity-doped regions, such as source and drain regions of a metal-oxide semiconductor (MOS) transistor. The conductivity of such an impurity-doped region depends on the concentration of the impurities therein. The higher the concentration of the impurities is, the higher the conductivity of the doped region achieves.

In general, there are various devices, including N-type MOS (NMOS) transistors, P-type MOS (PMOS) transistors, and complementary MOS (CMOS) transistors, built on a semiconductor wafer. Different types of doped regions are formed in these devices with different carriers, wherein electrons are provided as carriers by N-type impurity dopants, and electric holes are provided as carriers by P-type impurity dopants. Specific contact regions in specific devices must be electrically interconnected so as to implement the whole desired circuit function. Normally, these contact regions are already doped conductive regions and serve as electrodes in those devices. However, when the integration of the wafer increases and the dimension of the device scales down, the original doped concentration for the devices' electrodes may no longer provide a sufficient conductivity for the contact regions. Therefore, a contact ion implantation must be carried out to increase the doped concentration of the contact regions.

FIG. 1 illustrates an example of a semiconductor wafer 2 that consists of various devices with doped regions of different conductive types. A twin-well CMOS device is shown with an N-well region 4, a P-well region 6, field oxide regions 8, a PMOS device 10, and an NMOS device 20. A dielectric layer 30, wherein contact holes 32 and 34 are opened to provide contact to the interconnecting lines, is formed on the wafer. Generally, contact holes 32 and 34 are formed aligned to the source and drain regions 14 and 24 of the transistors, which are already doped conductive regions. As mentioned above, the original doped concentration for the source and drain regions can no longer provide a sufficient contact conductivity. Therefore, a contact ion implantation must be carried out to form contact regions for the source and drain regions.

In a conventional manner as mentioned above, masks with different patterns are usually used in different types of ion implantation. FIG. 2 illustrates the two mask patterns adopted for the example shown in FIG. 1. For the contact ion implantation of P-type ions, an implantation mask 40 as shown in FIG. 2A are patterned on the wafer. The blanket P-type ion implantation and the mask removing are then performed in sequence to form the P-type contact regions 16 in the PMOS device. Thereafter, an implantation mask 42 as shown in FIG. 2B are patterned on the wafer. The blanket N-type ion implantation and the mask removing are subsequently performed to form the N-type contact regions 26 in the NMOS device. In this method, two mask patterning, and two masking removing must be carried out. The fabrication processes are complicate.

SUMMARY OF THE INVENTION

The present invention proposes a method of contact ion implantation to form different types of doped contact regions in the semiconductor substrate. This method utilized only one mask and a dosage-enhanced implantation to implement the contact ion implantation. The fabrication process for the doped contact regions of various conductive types can thus be simplified.

A semiconductor substrate having doped regions of different conductive types and a dielectric layer with contact holes is provided. A blanket ion implantation of the first conductive type is carried out, and all the contact regions of first conductive type and second conductive type are formed with the first conductive type impurities. Thereafter, a mask with the pattern that covers the designed first type contact regions and exposes the second type regions is defined. An ion implantation of the second conductive type is then carried out to implant impurity ions of second conductive type with an enhanced dosage into the contact regions designed for second conductive type. The dosage of these second conductive type ions is determined so that, after the implantation, the contact regions of the second conductive type have a total concentration of the first and second type impurities that can provide a preferable amount of carriers. After removing the implantation mask, the present process is completed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

For a semiconductor substrate built with doped regions of different conductive types therein and a dielectric layer with contact holes thereon, the present invention proposes a method of contact ion implantation to form different types of doped contact regions with enhanced impurity concentration in the semiconductor substrate. This method utilized one mask and a dosage-enhanced implantation to implement the contact ion implantation. The fabrication process for the doped contact regions of various conductive types can thus be simplified.

Figure 1:
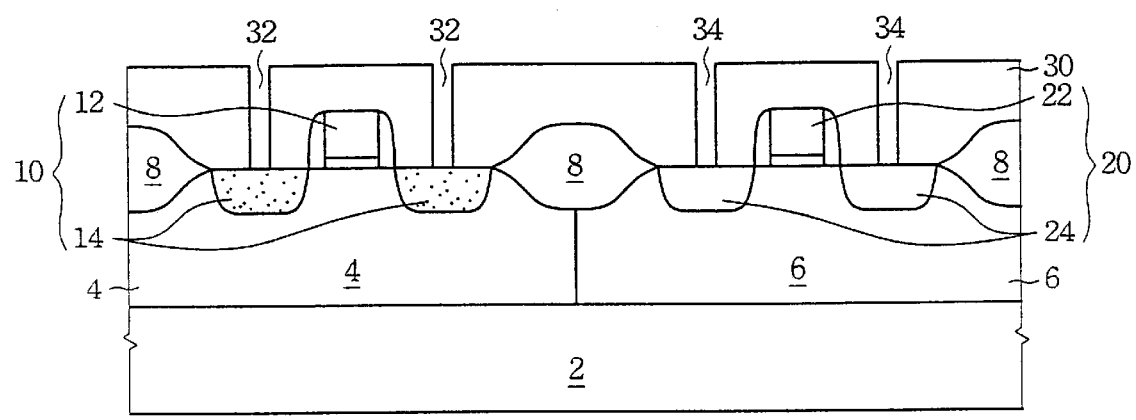
FIG. 1 is a cross-sectional view of a CMOS device with doped regions of different conductive types according to the prior art.
Figure 2A:
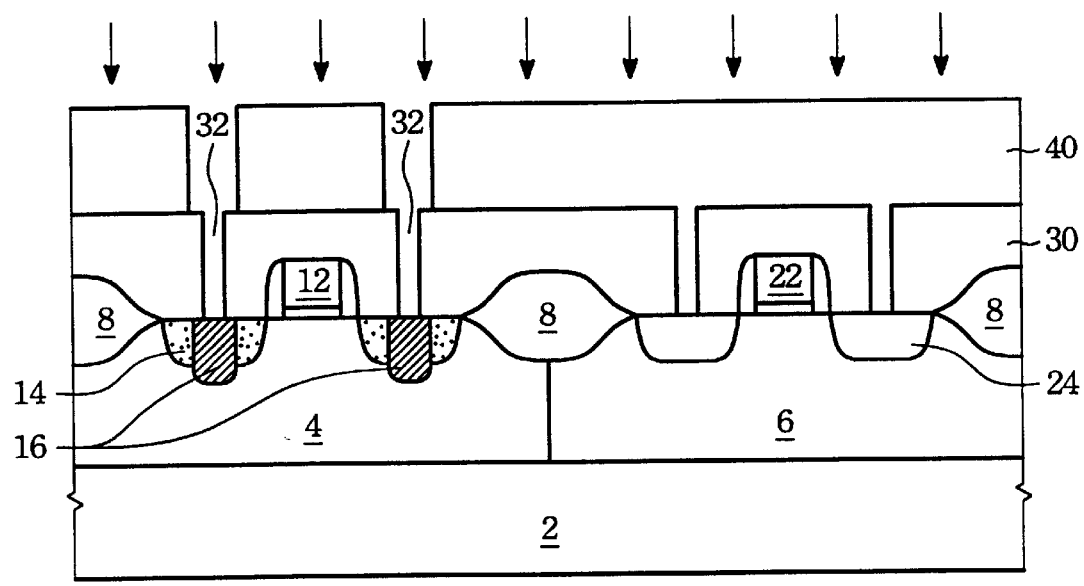
FIGS. 2A and 2B are cross-sectional views of conventional contact implantation masks using for the devices shown in FIG. 1.
Figure 2B:
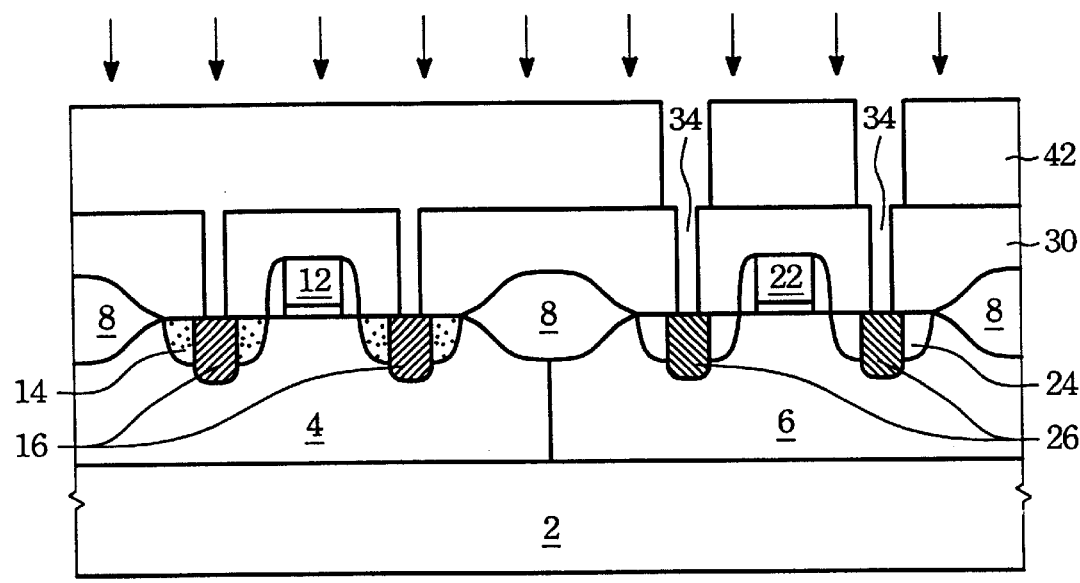
Figure 3:
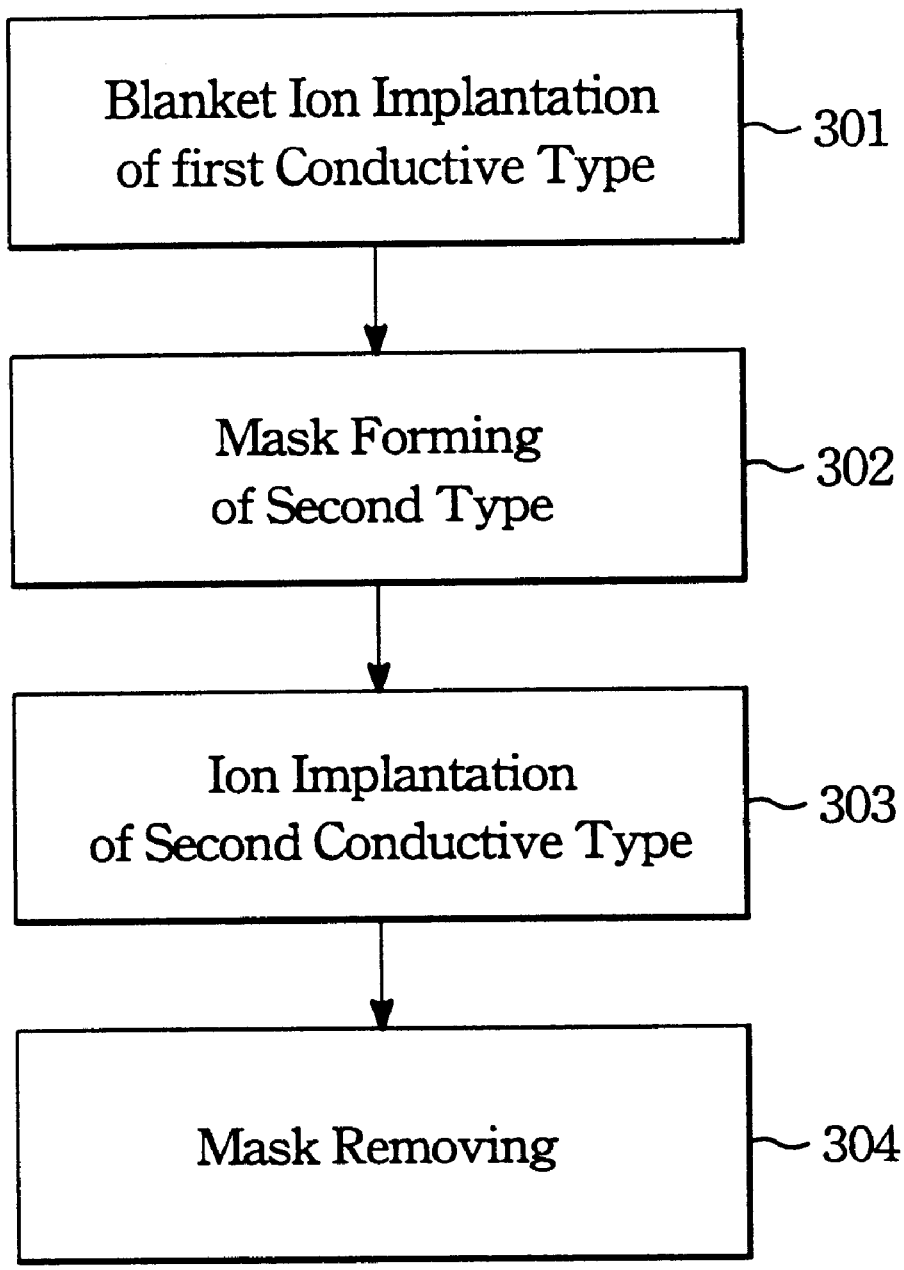
FIG. 3 is a flowchart of the main process for contact ion implantation according to the present invention.

FIG. 3 displays a flow chart of the present invention. When a semiconductor substrate having doped regions of different conductive types and a dielectric layer with contact holes is provided, a blanket ion implantation of the first conductive type is first carried out (step 301). At this implantation step, all the contact regions, no matter the regions of designed first type or designed second type, are formed with the first conductive type impurities. A dosage of the first conductive type ions that can provide a preferable concentration in the first conductive type contact regions is adopted.

Thereafter, an implantation mask with the second type pattern, which covers the designed first type contact regions and exposes the second type regions, is formed on the substrate (step 302). A second type ion implantation is then carried out to implant impurity ions of second conductive type into the substrate with an enhanced dosage (step 303). At this step, only the contact regions designed for second type are doped with the second conductive type ions. The dosage of these second conductive type ions is determined so as to convert the second type contact regions from the first conductive type into the second conductive type. That is, a portion of the second conductive type impurities neutralize all of the first conductive type impurity, and the rest of the second conductive type impurities can provide a preferable amount of second conductive type carriers. After the second type implantation, the implantation mask is removed (step 304) to complete the present process of contact ion implantation.

Figure 4:
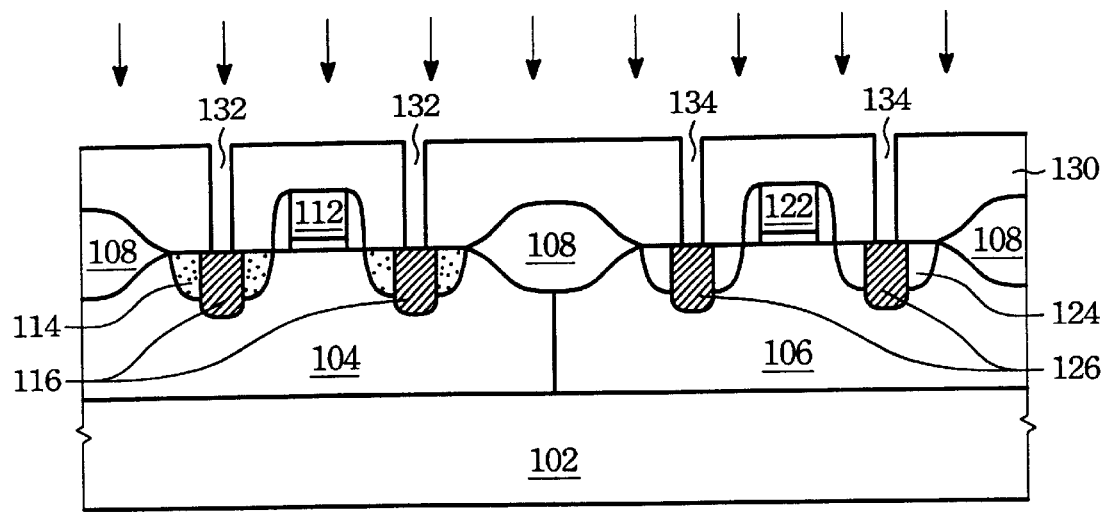
FIG. 4 is a cross-sectional view of a CMOS device on a semiconductor substrate illustrating the step of performing a contact implantation according to the present invention.
Figure 5:
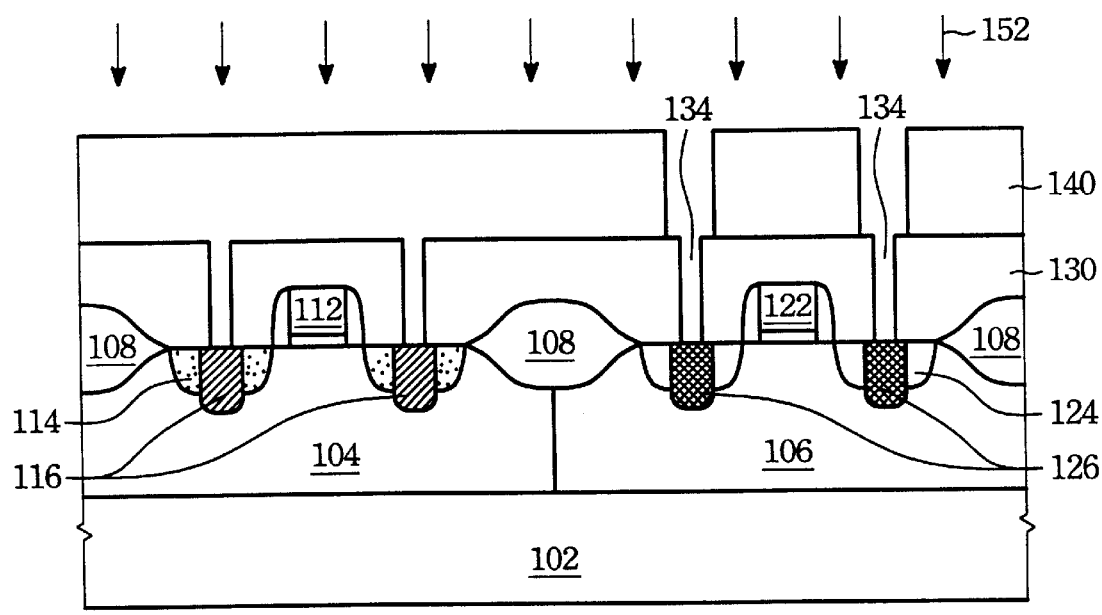
FIG. 5 is a cross-sectional view of a CMOS device on a semiconductor substrate illustrating the step of forming a implantation mask and performing a contact implantation according to the present invention.
Figure 6:
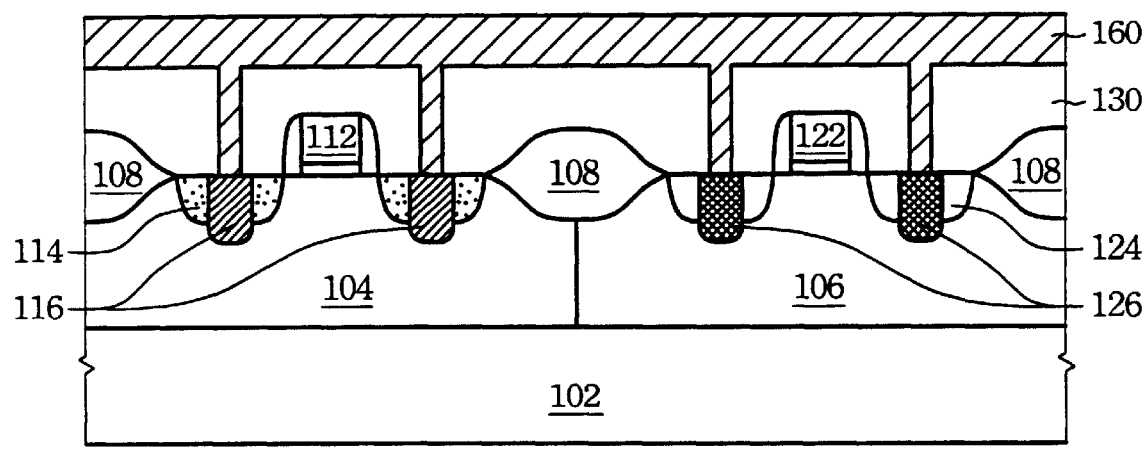
FIG. 6 is a cross-sectional view of a CMOS device on a semiconductor substrate illustrating the step of removing the implantation mask and depositing the interconnecting lines according to the present invention.

FIG. 4 to FIG. 6 illustrates an embodiment of the present invention, wherein a twin-well CMOS device with dielectric layer and contact holes are presented. In the semiconductor substrate 102, an N-well region 104 and a P-well region 106 are formed by N-type and P-type impurity doping respectively. Field oxide regions 108 are formed to provide isolation among devices. A PMOS device 110, including gate structure 112 and P-type doped source and drain regions 114, is built on the N-well region 104, and an NMOS device 120, including gate structure 122 and N-type doped source and drain regions 124, is built on the N-well region 106. An inter layer dielectric (ILD) layer 130 is deposited on the substrate, wherein contact holes 132 and 134 are formed to provide connection of the interconnecting lines and the doped regions of P type and N type respectively.

Referring to FIG. 4, a blanket ion implantation with the direction indicated by the arrows 150 is performed (step 301). P-type impurity ions, such as boron ions or $BF_2$ ions, are implanted into the substrate. Contact regions 1 16 and 126 are thus formed respectively right beneath the contact holes 132 and 134. In a preferred embodiment, $BF_2$ ions are adopted as the P-type impurity, and the implantation energy and dosage are respectively about 20–50 keV and about $1\times10^{15}$ atoms/cm$^2$. The fabrication of the P-type contact regions 116 is thus finished.

Next, as shown in FIG. 5, an implantation mask 140 is defined on the substrate by using a conventional manner of photolithography including photoresist coating, exposure, and development processes (step 302). The implantation mask 140 can be formed of photoresist or any other suitable masking materials with a thickness thick enough to prevent the ions of the subsequent implantation process pass through. The P-type contact regions 116, which are already completed, are covered by the implantation mask 140, and the N-type contact regions 126 are exposed.

Thereafter, the ion implantation with N-type impurity ions is carried out as indicated by the arrows 152 (step 303). The N-type implanted ions can be phosphorus ions, arsenic ions or antimony ions. With the implantation mask 140, only the contact regions 126 but 116 are doped at this step. In a preferred embodiment, arsenic ions are adopted as N-type impurities. The implantation energy and dosage are respectively about 30–60 keV and about $2\times10^{15}$ atoms/cm$^2$. Half of this dosage of arsenic ions can neutralize the effect of the previous implanted $BF_2^+$ impurities, and another half provide the sufficient carriers for desired N-type conductivity of the contact regions 126. Therefore, the contact regions 126 are converted from the P-type doped regions into the N-type doped regions.

Finally, the implantation mask 140 is removing (step 304). A wet clean process should be performed in consideration of cleaning the residual materials, such as polymer, if a photoresist mask is used. The interconnecting lines 160 are then deposited on the semiconductor substrate and fill the contact holes 132 and 134 as shown in FIG. 6.

According to the method proposed by the present invention that described above, various types of doped contact regions with enhanced impurity concentration can be formed in the semiconductor substrate. With a normal dosage implantation and an enhanced dosage implantation, only one mask is needed to differentiate the different conductive types of the doped contact region, and that is superior to the conventional method, which must use at least two masks to do the same work. The simplification of the fabrication process for the doped contact regions of various conductive types can thus be achieved.

The present method can also be applied to any kinds of devices in addition to a CMOS device mentioned in above embodiment, as long as there are different conductive type of contact region for forming. As is understood by a person who is skilled in the art, the foregoing preferred embodiments of the present invention are illustrated of the present invention rather than limiting of the present invention. It is intended to cover various modifications and similar arrangements included within the spirit and scope of the appended claims. The scope of such modifications should be accorded the broadest interpretation so as to encompass all such modifications and similar structure.

What is claimed is:

1. A method for forming various types of doped contact regions in a semiconductor substrate having at least a CMOS thereon for connecting to the interconnecting lines, said method comprising:

performing a first ion implantation to implant ions of first conductive type into said semiconductor substrate to form a first number of first conductive type doped regions;

forming an implantation mask to expose a second number of said first conductive type doped regions;

performing a second ion implantation to implant ions of second conductive type into said exposed second number of said first conductive type doped regions, thereby converting said exposed second number of said first conductive type doped regions into second conductive type doped regions; and removing said implantation mask.

2. The method according to claim 1, wherein said ions of first conductive type are P-type ions.

3. The method according to claim 2, wherein said P-type ions is selected from the group consisting of boron and $BF_2^+$.

4. The method according to claim 2, wherein said ions of second conductive type are N-type ions.

5. The method according to claim 4, wherein said N-type ions are selected from the group consisting of phosphorus ions, arsenic ions and antimony ions.

6. The method according to claim 1, wherein said ions of first conductive type are P-type ions.

7. The method according to claim 6, wherein said P-type ions are selected from the group consisting of boron ions and $BF_2^+$ ions.

8. The method according to claim 1, wherein said ions of second conductive type are N-type ions.

9. The method according to claim 8, wherein said N-type ions is selected from the group consisting of phosphorus ions, arsenic ions and antimony ions.

10. The method according to claim 1, wherein said second ion implantation is performed with a dosage enough to neutralize said first conductive type doped regions in addition to a dosage that can provide a desired conductivity of said second conductive type.

11. The method according to claim 1, wherein said second ion implantation is performed with a dosage double of the dosage of said first ion implantation.

12. The method according to claim 11, wherein said dosage of said second ion implantation is about $2 \times 10^{15}$ atoms/cm$^2$, and said dosage of said first ion implantation is about $1 \times 10^{15}$ atoms/cm$^2$.

13. A method for forming various types of doped contact regions in a semiconductor substrate having at least a CMOS thereon for connecting to the interconnecting lines, said method comprising:

performing a first ion implantation to implant P-type ions into said semiconductor substrate to form a first number of P-type doped regions;

forming an implantation mask to expose a second number of said P-type doped regions;

performing a second ion implantation to implant N-type ions into said exposed second number of said P-type doped regions, thereby converting said exposed second number of said P-type doped regions into N-type doped regions; and removing said implantation mask.

14. The method according to claim 13, wherein said P-type ions is selected from the group consisting of boron and $BF_2^+$.

15. The method according to claim 13, wherein said N-type ions are selected from the group consisting of phosphorus ions, arsenic ions and antimony ions.

16. The method according to claim 13, wherein said second ion implantation is performed with a dosage enough to neutralize said P-type doped regions in addition to a dosage that can provide a desired conductivity.

17. The method according to claim 16, wherein said second ion implantation is performed with a dosage double of the dosage of said first ion implantation.

18. The method according to claim 17, wherein said dosage of said second ion implantation is about $2 \times 10^{15}$ atoms/cm$^2$, and said dosage of said first ion implantation is about $1 \times 10^{15}$ atoms/cm$^2$.

19. A method for forming various types of doped contact regions in a semiconductor substrate having at least a CMOS thereon for connecting to the interconnecting lines, said method comprising:

performing a first ion implantation to implant $BF_2$ ions into said semiconductor substrate with a dosage of about $1 \times 10^{15}$ atoms/cm$^2$, thereby forming a first number of P-type doped regions;

forming an implantation mask to expose a second number of said P-type doped regions;

performing a second ion implantation to implant arsenic ions into said exposed second number of said P-type doped regions with a dosage of about $2 \times 10^{15}$ atoms/cm$^2$, thereby converting said exposed second number of said P-type doped regions into N-type doped regions; and removing said implantation mask.

* * * * *